(12) United States Patent
Alexander et al.

(10) Patent No.: US 6,388,885 B1
(45) Date of Patent: May 14, 2002

(54) CONTROLLER WITH HELICAL SPRING CONTACTS

(75) Inventors: Andrew D. Alexander, Seguin, TX (US); Heather L. Havlicsek, Chicago, IL (US); Kevin C. Loewe, Elk Grove Village, IL (US); Donald J. Zito, Fox River Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/643,537

(22) Filed: Aug. 22, 2000

(51) Int. Cl.7 ................................................ H05K 7/10
(52) U.S. Cl. ...................... 361/760; 361/769; 361/783; 361/798; 200/276; 200/276.1; 439/840; 439/841; 439/845
(58) Field of Search ................................ 361/760, 798, 361/783, 807, 769, 787; 200/513, 276, 276.1, 292, 43.18; 400/472; 439/840, 841, 245

(56) References Cited

U.S. PATENT DOCUMENTS

| | | | |
|---|---|---|---|
| 3,503,033 A | * 3/1970 | Kennedy | 339/17 |
| 5,159,751 A | 11/1992 | Cottingham et al. | 361/736 |
| 5,170,326 A | 12/1992 | Meny et al. | 291/832 |
| 5,216,581 A | 6/1993 | Fisher et al. | 361/728 |
| 6,000,679 A | 12/1999 | Reuter et al. | 251/129 |
| 6,120,114 A | * 9/2000 | Blazic et al. | 303/119.2 |

* cited by examiner

Primary Examiner—Jayprakash N. Gandhi
Assistant Examiner—Hung Bui
(74) Attorney, Agent, or Firm—Gary J. Cunningham; Steven A. May

(57) ABSTRACT

A user-friendly controller provides a special dynamic interconnect which reliably connects terminals of electronic device, such as solenoids, to a circuit board to enhance vehicle performance and help obtain a smoother more comfortable ride. The special interconnect comprises a coil spring contact. The coiled spring contact can have an enlarged head which can be soldered to a contact on the circuit board. The central portion of the spring contact provides a terminal-receiving opening to slidably receive the terminal of the electronic device. The smaller end portion of the spring contact can compressively engage and dynamically contact the terminal of the electronic device. A cover can be provided to environmentally protect and cover the circuitry and circuit board. The cover can have chambers for receiving and engaging the spring contacts.

20 Claims, 2 Drawing Sheets

CONTROLLER WITH HELICAL SPRING CONTACTS

BACKGROUND OF THE INVENTION

This invention relates to solenoid systems for use with vehicles and, more particularly, to a controller with improved contacts for use with such solenoid systems.

Solenoids are used in various vehicle systems to control the operation of vehicles. For example, solenoids are used in vehicles in transmissions systems, anti-lock braking systems (ABS), traction control systems, intelligent ride control systems, electronic control units, etc. Solenoids have coils and often cooperate with valves to control the flow of fluids, such as transmission fluids, brake fluids, motor oil, gasoline, etc. Solenoids systems help improve the performance and ride of vehicles.

Solenoid systems are typically controlled by electronic circuitry, such as from printed circuit boards. Solenoid pins or other terminals of the solenoids are connected to the circuitry by contacts. This connection can be difficult to obtain because of various tolerances required for the solenoid system.

Furthermore, the motion and dynamics of the vehicle can cause problems for solenoid systems. Internal combustion engines and diesel engines can cause vibrations, stress, shock, movement, and dynamic loading of the connection between the terminals of the solenoids and the contacts of the circuitry. Movement of vehicle during turning, acceleration, braking (deceleration), driving over bumps, pot holes, etc., can also cause movement, impact, increased dynamic loads, pressure, stress, and strain on the connection between the terminals of the solenoids and the contacts of the circuitry. The preceding effects from the engine and movement of vehicle can disconnect, break, or open the connections between the terminals of the solenoids and the contacts of the circuitry which can prevent the circuitry from activating, operating and controlling the solenoid system. This can cause failure and deactivation of the solenoid system which can result in poor vehicle performance and substandard operation which may even endanger the safety of the driver and passengers.

In the past, it has been suggested to use twin beam leads formed from a single stamped part that is press fit onto solenoid terminal pins. The ends of the stamped part also serve as a connector pin in a press fit manner or Tinnerman type clip style. A wire harness can mate to the pin and provide electrical connection to the circuitry. This suggested design and arrangement, however, requires a long lead frame connection to provide the requisite large true position tolerance. The long lead frame connection, however, occupies valuable circuit space. Furthermore, the suggested design requires the solenoids be used in conjunction with solder wave machines and does not provide the desire degree of strain relief.

Other conventional designs use rigid terminals that are waved soldered directly to a circuit board so that the solenoids are allowed to float. Still other conventional designs have coil wires that are directly wave soldered to the circuitry and are supported by a plastic housing to limit travel and float.

The preceding conventional devices, designs, and arrangements have met with varying degrees of success.

It is, therefore, desirably to provide an improved controller for use with solenoid systems in vehicles which overcomes most, if not all, of the preceding problems.

SUMMARY OF THE INVENTION

An improved controller is provided for use with a vehicle system equipped with an electronic device, such as a solenoid switch or intergrated circuit, to enhance vehicle performance and help achieve a smoother more comfortable ride. Advantageously, the high performance controller provides for a reliable dynamic connection of the electronic device to a circuit board even during vibrations, movements, dynamic forces, stress and strain from reciprocating pistons of an internal combustion engine or diesel engine and operation and driving of the vehicle during acceleration, braking, turning, and riding (travel) on bumps, pot holes, cracked pavement, gravel roads, etc. The user-friendly controller also provides a connection which allows for positional variation and vibration isolation as well as ease of assembly. The special controller further accommodates a connection which minimize circuit board area. The economical controller uses less material and can lower the cost for fabrication, tooling, and assembly. The compact controller provides for better use of the circuit board area and helps reduce pin count in a wire harness connection to the controller. Desirably, the dependable controller is efficient, safe and effective.

The unique controller can be used to improve performance in a vehicle, such as an automobile, sports utility vehicle (SUV), van, station wagon, truck, motorcycle, tractor, airplane, locomotive, train, ship, boat, forklift truck, crane, bulldozer, or load grading equipment.

The electronic device can have one or more terminals comprising a pin, post, or blade with a transverse span comprising a diameter or width.

The controller can comprise a circuit board with circuitry to control and operate the electronic device. The circuit board can have an opening with a contact position adjacent thereto, to receive a terminal of the solenoid or other electronic device. The circuit board can have a component-side which provides a circuit-supporting surface and an underside which provides an opposing surface. Preferably, the contact comprises at least one metal annular contact which is mounted upon one or more of the surfaces of the circuit board.

A special interconnect dynamically connects the terminal of the electronic device to the contact of the circuit board. Advantageously, the interconnect comprises a coiled spring having one end portion for contacting the contact of the circuit board and another end portion for contacting the terminal of the electronic device. Desirably, the coiled spring has coils with a minimum inside coil diameter which is greater than the transverse span of the terminal to slidably receive the terminal of the electronic device during operation of the vehicle. The spring can comprise a spiral spring and preferably comprises a helical spring. In the preferred form, the spring comprises a tapered spring or funnel-shaped spring. The center of the spring can be allowed to float to provide positional variation and movement, as well as to accommodate tolerance and slippage during assembly and use.

In the preferred form, one end portion of the spring is larger and comprises an enlarged head. Preferably, the enlarge head of the spring is soldered or otherwise fixedly connected to the contact of the circuit board. The larger end portion of the spring has a larger maximum outside diameter than the smaller end portion of the spring. In the illustrative embodiment, the larger end portion of the spring has a greater maximum outside diameter of the opening of the circuit board to prevent the enlarged head of the spring from passing through the opening of the circuit board. Preferably, the smaller end portion of the spring has a maximum outside diameter which is smaller than the opening in the circuit board so that the smaller end portion of the spring can pass through the opening of the circuit board.

A housing comprising a cover can be provided to environmentally protect and cover at least part of the circuit board. Preferably, the cover has a spring-receiving chamber to receive and engage the smaller end portion of the spring.

A more detailed explanation of the invention is provided in the following detailed description and appended claims taken in conjunction with the accompanying drawings.

DETAILED DESCRIPTION OF THE PREFERRED EMBODIMENTS

A vehicle controller 10 (FIGS. 1 and 3) provides a controller assembly and fixture for use in a vehicle system 12 (FIG. 1) of a vehicle. The controller can comprise an engine controller, transmission controller, braking controller, traction controller, ride controller, or other control unit. The vehicle system can comprise a solenoid system comprising a solenoid operated system, an intergrated circuit (IC) system comprising an intergrated circuit operated system, or a switching system comprising a switch operated system. The system can also comprise a transmission system, anti-lock braking system (ABS), traction control system, intelligent ride control system, etc.

Figure 1:
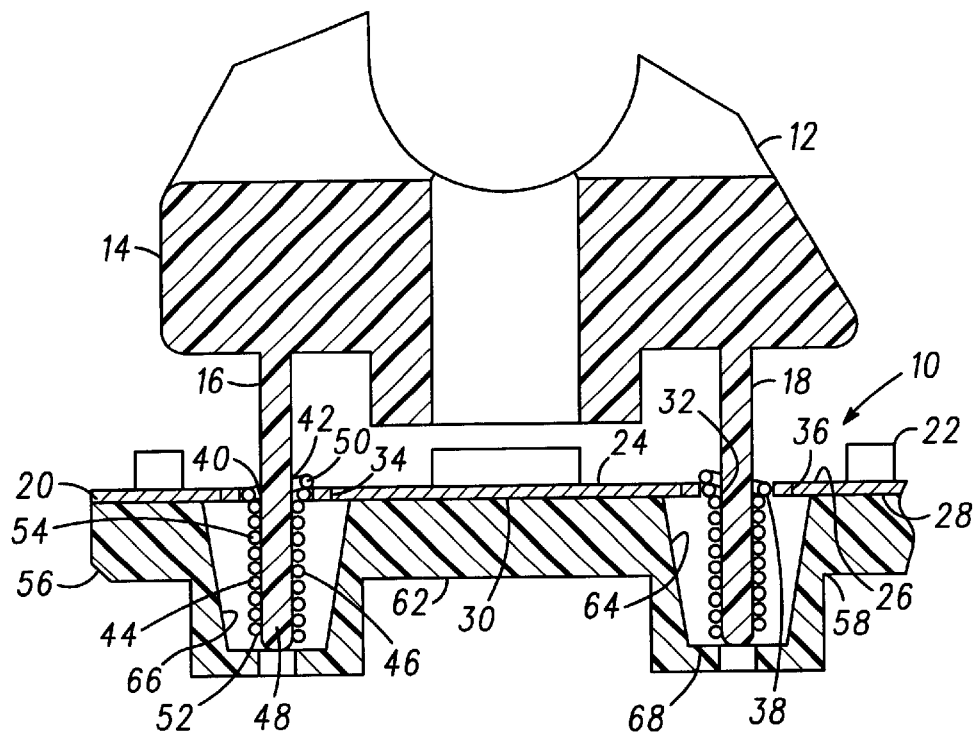
FIG. 1 a fragmentary cross-sectional view of a controller in accordance with principals of the present invention.

The vehicle system has one or more electronic devices 14 (FIG. 1). The electronic devices cooperate with the vehicle system and controller to regulated and control operation of the vehicle. The electronic device can comprise a solenoid comprising a solenoid coil for controlling one or more valves or other components in a solenoid system. The electronic device can also comprise an intergrated circuit for controlling components in an intergrated circuit system. The electronic device can further comprise a switch for controlling components in a switching system or other system. The electronic device has one or more elongated terminals 16 and 18 of electronically conductive metal. The terminals can comprise pins, posts, or blades. Each terminal has a width or diameter which defines a maximum transverse span.

A printed circuit board (PCB) 20 (FIG. 1) has electronic circuitry 22 to activate, control, regulate, operate, power, and drive the electronic device. The circuitry can have circuit components 22, such as resistors, capacitors, etc. The circuit board has a component side 24 which provides a support surface 26 that faces generally towards the electronic device. The component side and support surface of the printed circuit board supports the circuitry. The underside 28 of the printed circuit board provides an opposing cover-engaging surface 30 which faces generally away from the electronic device. The underside and opposing surface of the printed circuit board are positioned generally opposite and away from the component side and support surface of the printed circuit board.

The printed circuit board can also have a set, series, array, or group of holes that provide spring-receiving openings 32 (FIGS. I and 2). Each of the spring-receiving openings has a maximum inside opening-diameter and is associated with a metal contact assembly 34 (FIG. 1), such as a grommet-like annular metal contact assembly. The metal contact assembly comprises electronically conductive metal and is connected to the electronic circuitry of the printed circuit board. The annular contact assembly can comprise one or more annular contacts 36 which provide conductive contacts or rings. Each annular contact can comprise an annular component side-contact which is securely mounted on the component side and support surface of the printed circuit board about its associated spring-receiving opening. Each annular contact can also comprise an annular underside-contact which is securely mounted on the underside and opposing surface of the printed circuit board about its associated spring-receiving opening. The annular contact assembly can have an tubular middle portion 38 which extends between and connects the annular component side-contact and the annular underside-contact and can fit in the spring-receiving opening of the printed circuit board. The tubular middle portion of the annular contact assembly can define a contact-hole 40 which provides a contact-opening that is concentric and axially aligned with the spring-receiving opening of the printed circuit board. The contact-opening can have a maximum inside opening-diameter that is slightly smaller than its associated spring-receiving opening in the printed circuit board.

Figure 3:
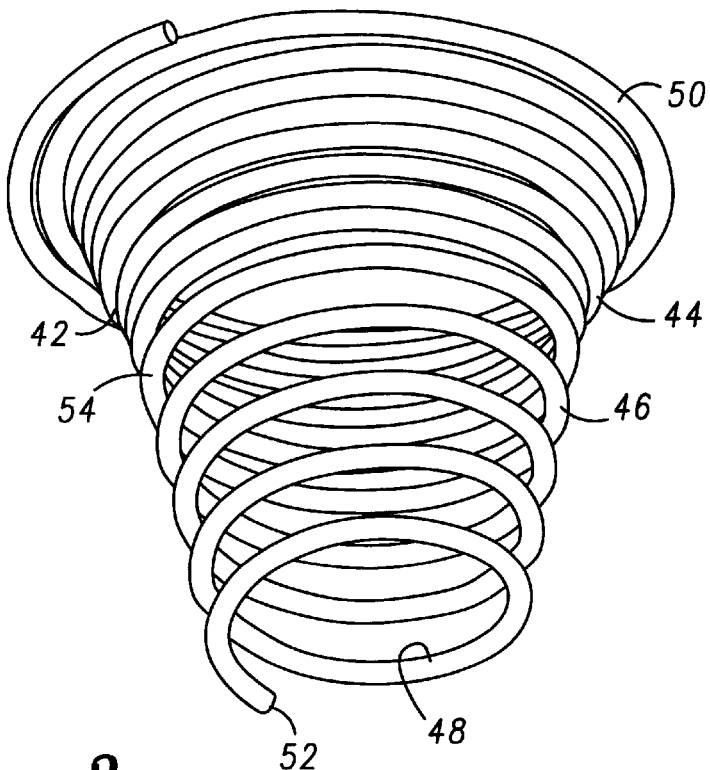
FIG. 3 is an enlarged perspective view of a spring contact for use in the controller.
Figure 4:
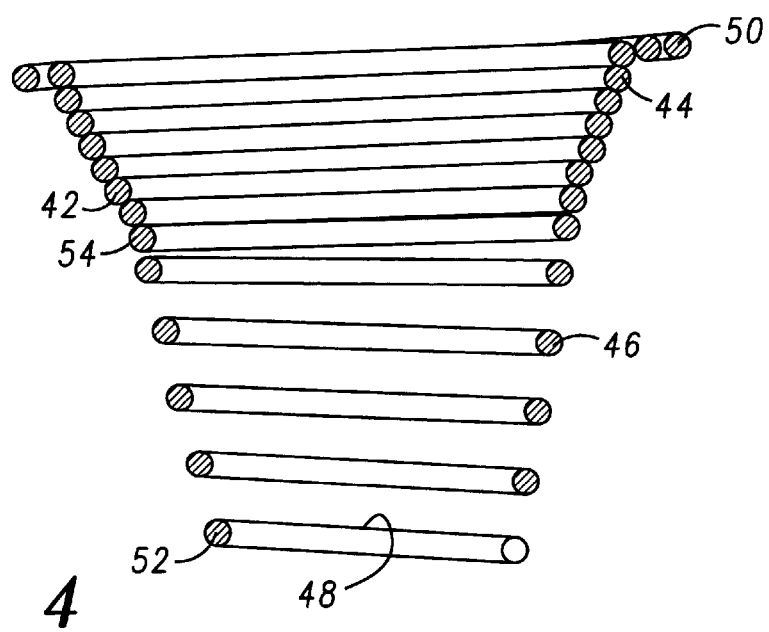
FIG. 4 is a cross-sectional view of the spring contact.

Interconnects 42 (FIGS. 1, 3 and 4) are provided to electrically and dynamically connect the terminals of the electronic device, e.g. solenoid, to the annular metal contact assembly of the printed circuit board. Each interconnect can comprise a coiled tapered metal spring contact which comprise generally funnel-shaped spiral coils 46 (FIGS. 3 and 4). In the preferred embodiment, the spring contact comprises a helical spring contact and the coils of the spring comprise helical coils. The coils have a minimum coil inside diameter and have an outside coil diameter. The coils cooperate with each other to provide and define an interior spring hole that provides an elongated interior terminal-receiving opening 48. The terminal-receiving opening is positioned radially inwardly of and is annularly surround by the coils of the spring contact. The terminal-receiving opening of the spring contact slidably, reciprocatingly, and matingly receives and engages a terminal of the electronic device, e.g. solenoid, during operation of the vehicle. The minimum inside coil diameter and minimum span of the terminal-receiving opening of the spring contact is greater than the maximum transverse span of the engaging terminal of the electronic device.

The tapered spring contact has a contact-engaging end portion 50 (FIGS. 1, 3 and 4) and a terminal-engaging end portion 52. The contact-engaging portion of the spring contact can comprise an enlarged head which is fixedly connected and soldered to the annular component side-contact on the support surface of the printed circuit board. Desirably, the enlarged head has a maximum outside head-diameter which is larger than the maximum inside opening-diameter of the spring-receiving opening and the contact-opening to prevent the enlarged head of the tapered metal spring contact from passing through the spring-receiving opening and the contact-opening of the printed circuit board. Preferably, the annular component side-contact has a maximum outside diameter at least as large as the maximum outside head-diameter of the enlarged head and contact-engaging end portion of the spring contact.

The terminal-engaging end portion 52 (FIGS. 1, 3 and 4) of the spring contact can comprise a coiled, spiral or helical foot which slidably and matingly engages and contacts the unattached distal end of the engaging terminal of the electronic device during operation of the vehicle. The terminal-engaging end portion or foot of the spring contact has a maximum outside foot-diameter which is smaller than the maximum outside head-diameter of the enlarged head of the spring contact. The terminal-engaging end portion and foot of the spring contact is positioned axially opposite and concentric to the enlarged head of the spring contact. The terminal-engaging end portion and foot of the spring contact is preferably spaced from or below the underside of the printed circuit board.

The spring contact has a tapered coiled, spiral or helical body 54 (FIGS. 1, 3 and 4). Preferably, the body of the spring contact has a maximum outside body-diameter less than the maximum inside opening diameter of the spring-receiving opening and the contact-opening of the printed circuit board in order to permit the body of the spring contact to pass through both the spring-receiving opening and the contact-opening of the printed circuit board.

The spring contact comprises electrically conductive spring metal. The spring contact is of a size, pitch, strength, flexibility, and resiliency, to accommodate and matingly engage the terminal of the electronic device during operation of the vehicle and a engine.

Figure 2:
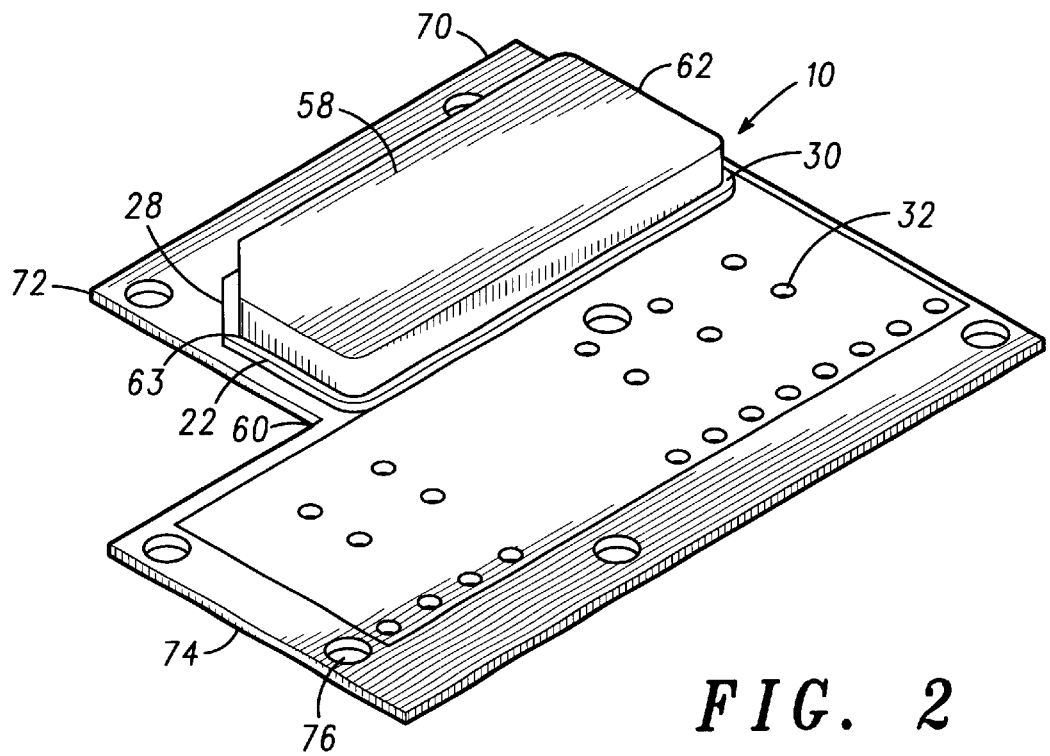
FIG. 2 is a perspective view of the underside of the controller.

A controller can comprise a housing assembly 56 (FIGS. 1 and 2). The housing assembly can comprise an underside housing 58 and a component side-housing 60 (FIG. 2). The underside housing can comprise an impact-resistant plastic cover to environmentally protect and cover at least a portion of the underside of the printed circuit board, preferably about the circuitry of the circuit board. Desirably, the cover comprising a fluid impervious (impermeable) plastic material to substantially prevent motor oil, transmission fluid, and other fluids from the engine of the vehicle from contacting and shorting the circuitry of the printed circuit board. The cover can have peripheral edge portions 63 (FIG. 2) which matingly engage and are fluidly sealed and secured by a sealant, such as epoxy resin, to the underside of the circuit board about the circuitry.

The cover of the housing assembly can provide a case with a set, series, array or group of spring-receiving chambers 64 (FIG. 1). The spring-receiving chambers can comprise recessed compartments, cavities, pockets, and/or sockets that receive the body and feet of the spring contacts. The spring-receiving chambers and spring contacts can have a frusto-conical, trapezoidal, or conical shape and configuration. The spring-receiving chambers can extend further than other sections of the cover in a direction away from the printed circuit board. Each spring-receiving chamber and socket has a minimum socket-diameter which is larger than the maximum outside foot-diameter and is larger than the maximum outside body-diameter of its associated spring contact. The cover can comprise a round socket-wall 66 (FIG. 1) about the spring-receiving chamber and socket. The cover can also have a substantially plainer or flat bight which provides an impact plate 68 that extends across the end portion of the socket wall and spring-receiving chamber along the underside of the cover. The bight and impact plate engage and compress the terminal-engaging end portion and foot of the spring contact when the cover is matingly engaged and secured to the underside of the circuit board.

The component side-housing 60 (FIG. 2) support, rigidifies, protects, and covers at least a portion of the component-side of the circuit board, preferably about the circuitry of the circuit board. Preferably, the component-side housing comprises fluid impervious (impermeable) material to help substantially prevent motor oil, transmission fluid, other fluids from the engine and vehicle from contacting and shorting the circuitry and component-side of the printed circuit board. The component side-housing can have a peripheral flange portion 70 which matingly engages and is fluidly sealed by a sealant, such as epoxy resign, to the component-side of the circuit board about the circuitry and the spring-receiving openings. In the illustrative embodiment, the component-side housing comprises a metal stiffener plate 72 and an component side-covering portion 74. The stiffener plate can matingly engage and help rigidify and support the component side of the circuit board about the circuitry. Preferably, the stiffener plate comprises an aluminum heatsink, heat spreader or heat pad and rigidizer. The component side-covering portion can matingly engage, rigidify and support the component-side of the printed circuit board about the spring-receiving openings. The component side-covering portion can be press fit, bonded or otherwise securely connected to the stiffener plate (rigidizer). The component side-covering portion can comprise impact-resistant plastic and is preferably molded of the same plastic as the cover providing the underside housing. The component side-covering portion can comprise or be part of a lead frame. Preferably, the component side-covering portion and stiffener plate (rigidizer) have the same thickness and are in coplanar relationship with each other. The peripheral flange portion of the component side-housing can have mounting holes 76. The housing assembly can be snap fit, bonded, or otherwise secured to the printed circuit board.

The controller can provide an electronic modular assembly. Preferably, the terminal-engaging portion and foot of the spring are not soldered or otherwise permanently fixed to the contact so that the terminal-engaging end portion, foot and center of the coil are allowed to float to provide for positional variation during assembly as well as to accommodate movement of the engaging terminal of the electronic device, e.g. solenoid. The clamping forces, compression and tension of the coiled wire spring contact provides an effective electrical connection because of the tapered shape and elastic properties of the wire spring contact. The spring contact can comprise electrically conductive metal, such as copper or copper alloy, e.g. brass, bronze, phosphorous bronze, beryllium copper, spring steel, stainless steel, etc. The metal contact can comprise an electrically conductive metal, such as copper, copper alloy, etc.

Various methods can be used to produce and assembly the controller. The printed circuit board can be formed with spring-receiving openings. The printed circuit board can be laminated to the rigidizer (stiffener plate) and the component side-covering portion. Solder paste can be screen printed onto pads and the annular contact assemblies. The spring contacts can be inserted in the spring-receiving openings against the annular metal contacts. This can be accomplished by bulk loading the spring contacts into a vibratory bowl feeder. The bowl feeder in connection with escapement tooling, which separates the spring contacts from each other, will orient and feed a single spring coil in a similar manner as screws and other components that are fed in a vibratory bowl feeder. The single coiled spring contacts can be pneumatically (air) fed through an air tube, one at a time, to a chuck mounted on the gripper at the end of a servo axis robot. The robot can move to position the coiled spring contact over the designated spring-receiving hole in the printed circuit board. Pneumatic driven rods in the robot can extend downwardly through the chuck or hand of the robot to insert the coiled spring contacts in the spring-receiving holes of the printed circuit board so that the contact-engaging end portion and enlarged head of the spring contact are seated securely against the annular contacts on the printed circuit board. The spring contacts can be blown into place by air pressure and put on a reel tape for use with ribbon trays. The preceding procedure can then repeated for each of the spring contacts which are inserted through the spring-receiving openings and positioned against their associated annular contacts. Thereafter, the components of the electronic circuitry can be placed on the printed circuit board. Afterwards, a reflow procedure can be used to melt the solder to the circuitry to connect the components of the circuitry to each other and to the annular contacts. The reflow procedure will also melt the solder to securely solder and connect the contact-engaging end portions and enlarged heads of the spring contacts to their respective annular contacts.

The cover of the assembly can be placed against the underside of the printed circuit board before or after the reflow procedures. Other assembly procedures can be used. It is preferred to use a sealant to connect the housing assembly to the printed circuit board that is impervious to motor oil, transmission fluid and other fluids in the engine and vehicle.

Among the many advantages of the inventive controller are:

1. Outstanding performance.
2. Helps achieve a smoother and more comfortable ride in vehicles.
3. Superb connections for terminals of solenoids and other electronic devices.
4. Accommodates positional variation.
5. Allows vibration isolation.
6. Ease of assembly.
7. Uses less material.
8. Lowers the cost of fabrication tooling.
9. Decreases the cost and time for assembly.
10. Provides better use of the circuit board.
11. Helps decrease connector pin count in the wire harness connection to the electronic controller.
12. Enhanced wear.
13. Reusable.
14. User-friendly.
15. Safe.
16. Economical.
17. Reliable.
18. Efficient.
19. Effective.

Although embodiments of the invention have been shown and described, it is to be understood that various modifications, substitutions and rearrangements of parts, components and process steps, can be made by those skilled in the art without departing from the novel spirit and scope of this invention.

What is claimed is:

1. A controller for use in a vehicle, comprising:
    an electronic device having at least one terminal, said terminal having a transverse span;
    a circuit board for controlling and operating said electronic device, said circuit board defining an opening for receiving said terminal and said circuit board having a contact positioned adjacent to said opening;
    an interconnect for connecting said terminal to said contact, said interconnect comprising a coiled spring having a first end portion for contacting said contact of said circuit board and a second end portion for contacting said terminal, and said coiled spring having coils with an minimum inside coil diameter greater than the transverse span of said terminal for slidably receiving said terminal during operation of the vehicle; and
    a housing comprising a spring-receiving chamber, said spring-receiving chamber capable of receiving and engaging said second end portion of said coiled spring and, by engaging said second end portion, providing a retention feature for said coiled spring when said coiled spring is disposed in said spring-receiving chamber and said terminal is inserted into, and makes electrical connection with, said-coiled spring.

2. A controller in accordance with claim 1 wherein said electronic device is selected from the group consisting of: a solenoid, integrated circuit and switch.

3. A controller in accordance with claim 1 wherein said terminal is selected from the group consisting of: a pin, post and blade.

4. A controller in accordance with claim 1 wherein said vehicle is selected from the group consisting of: an automobile, sports utility vehicle (SUV), van, station wagon, truck, motorcycle, tractor, airplane, locomotive, ship, boat, forklift truck, crane, bulldozer, and road grading equipment.

5. A controller in accordance with claim 1 wherein:
    said circuit board has a circuit-supporting surface and an opposing surface; and
    said contact comprises a metal annular contact mounted upon at least one of said surfaces of said circuit board.

6. A controller in accordance with claim 1 wherein said one end portion of said spring has a maximum outside diameter greater than a maximum outside diameter of the other end portion of said spring.

7. A controller in accordance with claim 6 wherein said one end portion of said spring comprises an enlarged head fixedly connected to said contact.

8. A controller in accordance with claim 6 wherein said opening in said circuit board has a maximum diameter greater than the maximum outside diameter of the small other end portion of said spring for receiving the small other end portion of said spring.

9. A controller in accordance with claim 8 wherein said larger one end portion has a greater maximum outside diameter than the maximum diameter of said opening to prevent said larger end portion from passing through said opening.

10. A controller for use in a vehicle, comprising:
    an electronic device having at least one terminal with a maximum transverse span;
    a circuit board having circuitry for controlling and operating said electronic device, said circuit board having a support surface facing generally towards said electronic device for supporting said circuitry and an opposing surface facing generally away from said electronic device and opposite said support surface, said circuit board defining a spring-receiving opening, and an annular metal contact mounted on at least one of said surfaces about said spring-receiving opening;
    an interconnect for connecting said terminal of said electronic device to said annular metal contact of said circuit board, said interconnect comprising a coiled spring contact having a contact-engaging portion connected to said annular metal contact of said circuit board, said spring having a terminal-engaging portion for contacting said terminal of said electronic device, said spring contact having coils with a maximum inside coil diameter greater than the maximum transverse span of said terminal for slidably receiving and contacting said terminal during operation of the vehicle, and some of said coils in proximity to said terminal-engaging portion having an outside coil diameter less than said spring-receiving opening of said circuit board so that said coils can pass through said spring-receiving opening of said circuit board; and a housing comprising a spring-receiving chamber, said spring-receiving chamber capable of receiving and engaging said terminal-engaging portion of said coiled spring and, by engaging said terminal-engaging portion, providing a retention feature for said coiled spring when said coiled spring is disposed in said spring-receiving chamber and said terminal is inserted into, and makes electrical connection with, said coiled spring.

11. A controller in accordance with claim 10 wherein said spring contact comprises a spiral spring contact.

12. A controller in accordance with claim 10 wherein said spring contact comprises a helical spring contact.

13. A controller in accordance with claim 10 wherein said spring contact comprises a tapered spring contact.

14. A controller in accordance with claim 10 wherein said spring contact comprises a funnel-shaped spring contact.

15. A controller in accordance with claim 10 including:

a cover for covering at least part of said circuit board; and said cover defines a chamber for receiving said terminal-engaging portion of said spring.

16. A controller for use in a vehicle, comprising:

an electronic device for regulating operation of a vehicle, said electronic device being selected from the group consisting of a solenoid, integrated circuit, and switch, said electronic device having at least one elongated terminal selected from the group consisting of a pin, post and blade, said terminal having a width or diameter defining a maximum transverse span;

a printed circuit board having circuitry for activating, controlling and operating said electronic device, said circuit board having a component side providing a support surface facing generally towards said electronic device for supporting said circuitry, an underside providing an opposing cover-engaging surface facing generally away from said electronic device and opposite said support surface, said circuit board defining a spring-receiving opening with a maximum inside opening-diameter, a grommet-like annular metal contact assembly connected to said circuitry, said annular metal contact assembly comprising an annular component side-contact mounted on said support surface about said spring-receiving opening and an annular underside-contact mounted on said opposing surface about said spring-receiving opening, said annular contact assembly having a tubular middle portion extending between and connecting said annular component side-contact and said annular underside-contact, said tubular middle portion of said annular contact assembly defining a contact-opening substantially concentric with said spring-receiving opening, said contact-opening having a maximum inside opening-diameter;

an interconnect for connecting said terminal of said electronic device to said annular metal contact assembly of said circuit board, said interconnect comprising a coiled tapered metal spring contact comprising generally funnel-shaped spiral coils with a minimum inside coil diameter and an outside coil diameter, said spiral coils cooperating with each other to define an interior terminal-receiving opening positioned radially inwardly of and annularly surrounded by said coils to slidably and reciprocatingly receiving said terminal of said electronic device during operation of the vehicle, said minimum inside coil diameter being greater than the maximum transverse span of said terminal, said coiled tapered metal spring contact having a contact-engaging end portion and a terminal-engaging end portion, said contact-engaging end portion having an enlarged head fixedly connected and soldered to said annular component side-contact on said support surface of said circuit board, said enlarged head having a maximum outside head-diameter larger than said maximum inside opening-diameter of said spring-receiving opening and said contact-opening to prevent said enlarged head of said tapered metal spring contact from passing through said spring-receiving opening and said contact opening, said contact-engaging end portion comprising a spiral foot for slidably engaging and contacting said terminal of said electronic device during operation of the vehicle, said spiral foot having a maximum outside foot-diameter smaller than said maximum outside head-diameter of said enlarged head, said spiral foot being positioned axially opposite said enlarged head at a location spaced from and said underside of said circuit board, said metal spring contact having a tapered spiral body extending between and connecting said enlarged head to said tapered foot, said tapered spiral body having a maximum outside body-diameter less than said maximum inside-opening diameter of said spring-receiving opening and said contact-opening to permit said spiral body of said spring contact to pass through both said spring-receiving opening and said contact-opening of said circuit board; and a housing assembly comprising an underside housing, said underside housing comprising an impact-resistant cover for protecting and covering at least a portion of the underside of said circuit board, said cover comprising a fluid impervious material for substantially preventing motor oil, transmission fluid and other fluids from an engine of a vehicle from contacting said circuitry on said circuit board, said cover having peripheral edge portions for matingly engaging and being fluidly sealed to the underside of said circuit board about said circuitry, said cover defining a recessed spring-receiving chamber providing a socket for receiving said spiral body and spiral foot of said spring contact, said socket having a minimum socket-diameter larger than said maximum outside foot-diameter of said spring contact, and said cover comprising a round socketwall with a substantially planar bight providing an impact plate for engaging said spiral foot and compressing said spring contact when said cover is matingly engaged to the underside of said circuit board.

17. A controller in accordance with claim 16 wherein:

said metal spring contact comprises a coiled tapered helical spring contact; and said coils comprise helical coils.

18. A controller in accordance with claim 16 wherein said annular component side-contact has a maximum outside diameter at least as large as the maximum outside head-diameter of said enlarged head of said spring contact.

19. A controller in accordance with claim 18 wherein said housing assembly includes a component side-housing for protecting and covering at least a portion of the component-side of said circuit board, said component side-housing comprising fluid impervious material for helping substantially prevent motor oil, transmission fluid and other fluids from an engine of the vehicle form contacting said circuitry and component-side of said circuit board, said component side-housing having a peripherally flange portion for matingly engaging and being fluidly sealed to the component-side of said circuit board, and said component-side housing comprising a metal stiffener plate for helping rigidify said circuit board and having an impact resistant component side-covering portion secured to said stiffener plate.

20. A controller in accordance with claim 19 wherein:
said stiffener plate comprises an aluminum heatsink;
said component side-covering portion comprises plastic;
said component side-covering portion and said stiffener plate have substantially similar thicknesses and are substantially in coplanar relationship to each other; and
said cover comprises a similar plastic as said component side-covering portion.

* * * * *